United States Patent
Lee et al.

(10) Patent No.: US 10,186,544 B2
(45) Date of Patent: Jan. 22, 2019

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Gae Hwang Lee, Seongnam-si (KR); Kwang Hee Lee, Hwaseong-si (KR); Kyu Sik Kim, Yongin-si (KR); Sung Young Yun, Suwon-si (KR); Dong-Seok Leem, Hwaseong-si (KR); Yong Wan Jin, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/283,698

(22) Filed: Oct. 3, 2016

(65) Prior Publication Data

US 2017/0287971 A1    Oct. 5, 2017

(30) Foreign Application Priority Data

Mar. 31, 2016    (KR) .................. 10-2016-0039464

(51) Int. Cl.
*H01L 31/00* (2006.01)
*H01L 27/146* (2006.01)

(52) U.S. Cl.
CPC .... *H01L 27/14645* (2013.01); *H01L 27/1461* (2013.01); *H01L 27/14636* (2013.01)

(58) Field of Classification Search
CPC ......... H01L 27/14645; H01L 27/14636; H01L 27/1461
See application file for complete search history.

(56) References Cited

U.S. PATENT DOCUMENTS

| | | | |
|---|---|---|---|
| 7,489,352 B2 | 2/2009 | Nakamura | |
| 8,520,105 B2 | 8/2013 | Funatsu et al. | |
| 8,848,063 B2 | 9/2014 | Jo et al. | |
| 2007/0296835 A1* | 12/2007 | Olsen | H01L 27/14652 348/234 |
| 2008/0174851 A1* | 7/2008 | Kawai | G02F 1/13624 359/296 |

(Continued)

FOREIGN PATENT DOCUMENTS

| | | |
|---|---|---|
| JP | 2014165286 A | 9/2014 |
| KR | 20110131171 A | 12/2011 |

*Primary Examiner* — Stephen Bradley
*Assistant Examiner* — Wasiul Haider
(74) *Attorney, Agent, or Firm* — Harness, Dickey & Pierce, PLC

(57) ABSTRACT

An image sensor includes a semiconductor substrate and a photoelectric conversion device on the semiconductor substrate and including a plurality of pixel electrodes, a light absorption layer, and a common electrode. The plurality of pixel electrodes may include a first pixel electrode and a second pixel electrode. The photoelectric conversion device may include a first photoelectric conversion region defined in an overlapping region with the first pixel electrode, the light absorption layer, and the common electrode, and a second photoelectric conversion region defined in an overlapping region with the second pixel electrode, the light absorption layer, and the common electrode. Sensitivity of the first photoelectric conversion region may be higher than sensitivity of the second photoelectric conversion region. An electronic device may include the image sensor.

29 Claims, 11 Drawing Sheets

(56) References Cited

U.S. PATENT DOCUMENTS

| | | | |
|---|---|---|---|
| 2010/0118170 A1* | 5/2010 | Matsumoto | H01L 27/14603 348/294 |
| 2011/0156996 A1* | 6/2011 | Izumi | G06F 3/0412 345/92 |
| 2014/0117321 A1* | 5/2014 | Lim | C07C 13/62 257/40 |
| 2015/0090863 A1 | 4/2015 | Mansoorian et al. | |
| 2015/0214395 A1 | 7/2015 | Yamamura et al. | |
| 2015/0255498 A1* | 9/2015 | Sugiura | H01L 27/14621 257/432 |

\* cited by examiner

IMAGE SENSOR AND ELECTRONIC DEVICE INCLUDING THE SAME

CROSS REFERENCE TO RELATED APPLICATIONS

This application claims priority to and the benefit of Korean Patent Application No. 10-2016-0039464 filed in the Korean Intellectual Property Office on Mar. 31, 2016, the entire contents of which are incorporated herein by reference.

BACKGROUND

1. Field

Embodiments relate to image sensors and electronic devices including the same.

2. Description of the Related Art

An imaging device generates an image and may store the same as an electrical signal. The imaging device includes an image sensor that separates the incident light into separate components according to incident light wavelength and converts each component to an electrical signal.

An image sensor may convert light into a charge, store the charge in a storage device, and then, convert the stored charge into an electrical signal. Herein, since the charge is stored in a limited amount in one pixel, exposure time may be appropriately determined depending on a light dose of an object, so that the charge may be stored in an appropriate amount. For example, the exposure time may be longer in a dark, low illuminance environment but may be shorter in a bright, high illuminance environment.

However, when a bright object and a dark object coexist, the exposure time for simultaneously optimally expressing two objects is difficult to determine. Accordingly, technology of expanding a light dose range, that is, a dynamic range that the image sensor may express, is researched.

SUMMARY

Some example embodiments provide an image sensor capable of realizing a wide dynamic range.

Some example embodiments provide an electronic device including the image sensor.

According to some example embodiments, an image sensor includes a semiconductor substrate and a photoelectric conversion device on the semiconductor substrate, the photoelectric conversion device including a plurality of pixel electrodes, a light absorption layer, and a common electrode, the plurality of pixel electrodes including a first pixel electrode and a second pixel electrode. The photoelectric conversion device may include a first photoelectric conversion region defined by an overlapping region of the first pixel electrode, the light absorption layer, and the common electrode, the first photoelectric conversion region being associated with a first photoelectric sensitivity, and a second photoelectric conversion region defined by an overlapping region of the second pixel electrode, the light absorption layer, and the common electrode, the second photoelectric conversion region being associated with a second photoelectric sensitivity. The first photoelectric sensitivity may be greater than the second photoelectric sensitivity.

The first photoelectric region may be associated with a first photoelectric conversion efficiency, the second photoelectric region may be associated with a second photoelectric conversion efficiency, and the first photoelectric conversion efficiency may be greater than the second photoelectric conversion efficiency.

The second photoelectric conversion region may include a charge control layer between the second pixel electrode and the light absorption layer and configured to reduce charge mobility from the light absorption layer to the second pixel electrode.

The charge control layer may include an inorganic material.

The charge control layer may include at least one through-hole between the second pixel electrode and the light absorption layer.

The photoelectric conversion device may include a planarization layer between the first pixel electrode and the second pixel electrode and between the second pixel electrode and the light absorption layer.

The planarization layer may include at least one of a silicon oxide material and a silicon nitride material.

The first pixel electrode may include a first transparent conductor, the second pixel electrode may include a second transparent conductor, and a sheet resistance of the first transparent conductor is lower than a sheet resistance of the second transparent conductor.

The first transparent conductor and the second transparent conductor may include one of an indium tin oxide (ITO) material or an indium zinc oxide (IZO) material, the ITO and the IZO materials may have different sheet resistances, and a sheet resistance of the first transparent conductor may be less than a sheet resistance of the second transparent conductor by a factor of at least approximately ten.

The first transparent conductor and the second transparent conductor may each include a different metal, respectively, and a sheet resistance of the first transparent conductor may be less than a sheet resistance of the second transparent conductor by a factor of at least approximately ten.

The first pixel electrode and the second pixel electrode may have different areas, respectively.

The first photoelectric conversion efficiency may be greater than the second photoelectric conversion efficiency by a factor of at least approximately 1.5.

The first pixel electrode and the second pixel electrode may have different areas, respectively.

An area of the first pixel electrode may be greater than an area of the second pixel electrode by a factor of at least approximately 1.5.

The light absorption layer may be configured to selectively absorb a first wavelength spectrum of light selected from one of a wavelength spectrum associated with red light, a wavelength spectrum associated with green light, and a wavelength spectrum associated with blue light. The semiconductor substrate may include a first photo-sensing device configured to sense a second wavelength spectrum of light selected from one of a wavelength spectrum associated with red light, a wavelength spectrum associated with green light, and a wavelength spectrum associated with blue light, and a second photo-sensing device configured to sense a third wavelength spectrum of light selected from one of a wavelength spectrum associated with red light, a wavelength spectrum associated with green light, and a wavelength spectrum associated with blue light. The first wavelength spectrum of light, the second wavelength spectrum of light and the third wavelength spectrum of light may each be different wavelength spectra of light.

The first photo-sensing device and the second photo-sensing device may be substantially parallel to a surface of the semiconductor substrate.

The first photoelectric conversion region may vertically overlap with one of the first photo-sensing device and the second photo-sensing device, and the second photoelectric conversion region may vertically overlap with another one of the first photo-sensing device and the second photo-sensing device.

The first photo-sensing device and the second photo-sensing device may vertically overlap with each other in a thickness direction of the semiconductor substrate.

According to some example embodiments, an electronic device includes the image sensor.

According to some example embodiments, an image sensor may include a first photoelectric conversion region that includes a first pixel electrode, a first portion of a light absorption layer on the first pixel electrode, and a first portion of a common electrode on the first portion of the light absorption layer, wherein the first photoelectric conversion region is associated with a first photoelectric sensitivity; and a second photoelectric conversion region that includes a second pixel electrode, a second portion of the light absorption layer on the second pixel electrode, and a second portion of the common electrode on the second portion of the light absorption layer, wherein the second photoelectric conversion region is associated with a second photoelectric sensitivity, and the second photoelectric sensitivity is different than the first photoelectric sensitivity.

The second photoelectric conversion region may include a charge control layer between the second pixel electrode and the second portion of the light absorption layer, and the charge control layer may be configured to reduce charge mobility from the light absorption layer to the second pixel electrode.

The image sensor may further include a planarization layer between the first pixel electrode and the second pixel electrode and between the second pixel electrode and the second portion of the light absorption layer.

The first pixel electrode may have a lower sheet resistance than the second pixel electrode.

The first pixel electrode and the second pixel electrode may have different areas, respectively.

The image sensor may further include a semiconductor substrate that includes a first photo-sensing device that vertically overlaps the first photoelectric conversion region, and a second photo-sensing device that vertically overlaps the second photoelectric conversion region.

The first photo-sensing device and the second photo-sensing device may be configured to sense different wavelength spectra of light.

The image sensor may further include a semiconductor substrate that includes a first photo-sensing device that vertically overlaps the first photoelectric conversion region, and a second photo-sensing device that vertically overlaps the first photo-sensing device.

According to some example embodiments, a photoelectric conversion device may include first and second pixel electrodes, a light absorption layer on the first and second pixel electrodes, a common electrode on the light absorption layer, and a charge control layer between the second pixel electrode and the light absorption layer, wherein the charge control layer is not between the first pixel electrode and the light absorption layer.

The charge control layer may include at least one through-hole between the second pixel electrode and the light absorption layer.

An electronic device may include the photoelectric conversion device.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1A:
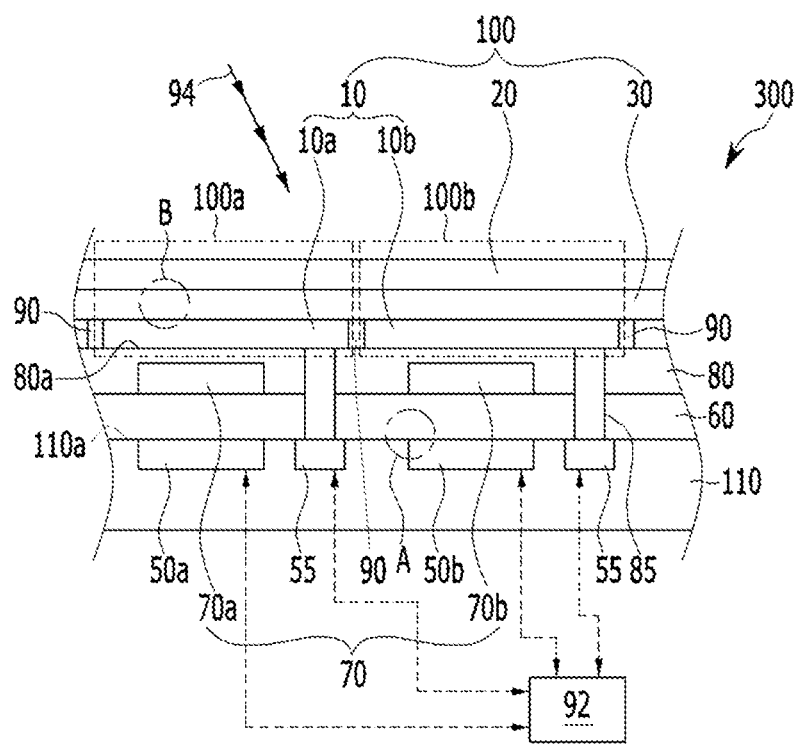
FIG. 1A is a schematic cross-sectional view showing an image sensor according to some example embodiments.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element, there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In the following descriptions, it is described that the light-receiving surface is on the image sensor, but this is for the better understanding and ease of description, and does not limit the position relationship.

Hereinafter, an example of an image sensor according to some example embodiments is described referring to drawings. As an example of an image sensor, an organic CMOS image sensor is described.

Figure 1B:
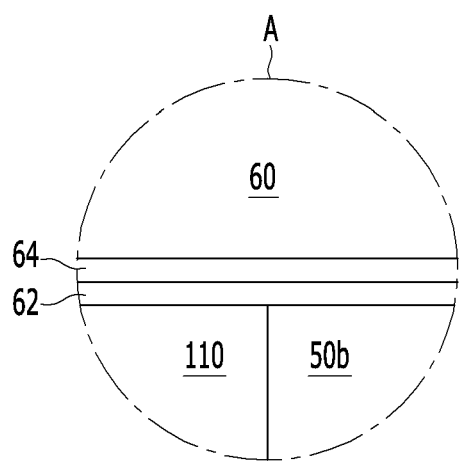
FIG. 1B is a schematic cross-sectional view showing a portion of the image sensor shown in FIG. 1A.
Figure 1C:
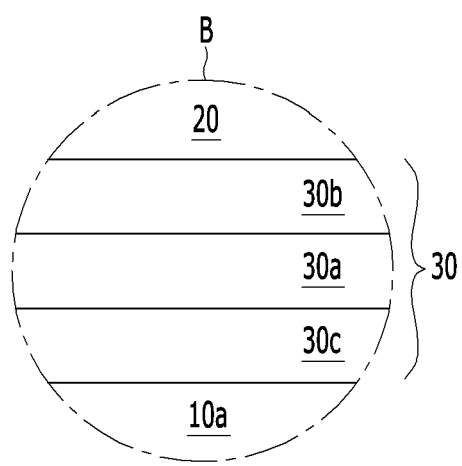
FIG. 1C is a schematic cross-sectional view showing a portion of the image sensor shown in FIG. 1A.
Figure 2:
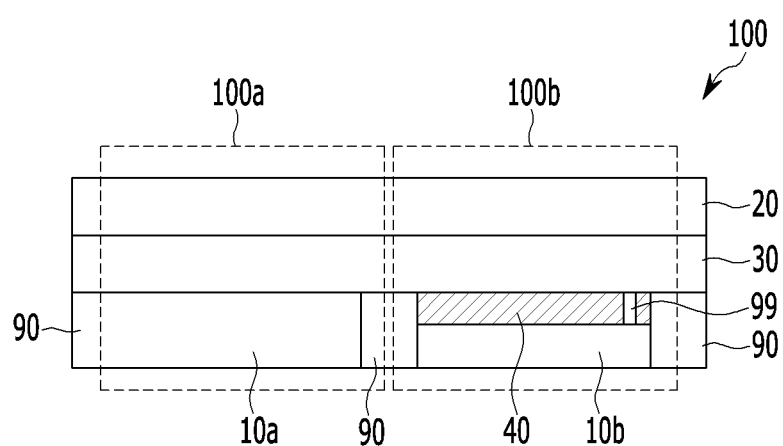
FIG. 2 is a schematic view showing a photoelectric conversion device that includes a photoelectric conversion region having high sensitivity and a photoelectric conversion region having low sensitivity in each image sensor according to some example embodiments.
Figure 3:
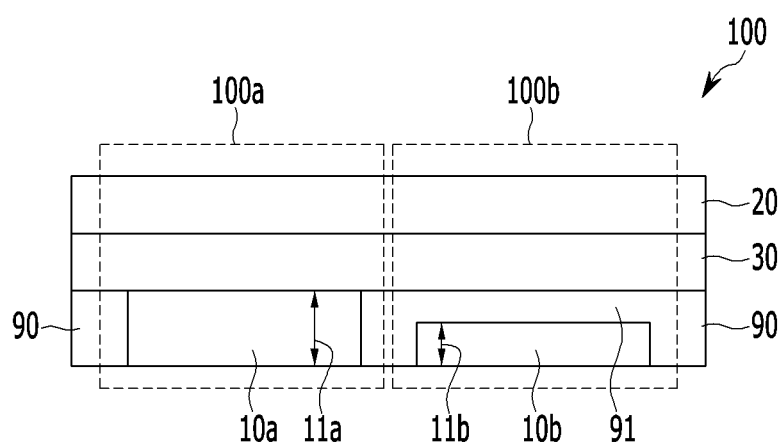
FIG. 3 is a schematic view showing a photoelectric conversion device that includes a photoelectric conversion region having high sensitivity and a photoelectric conversion region having low sensitivity in each image sensor according to some example embodiments.
Figure 4:
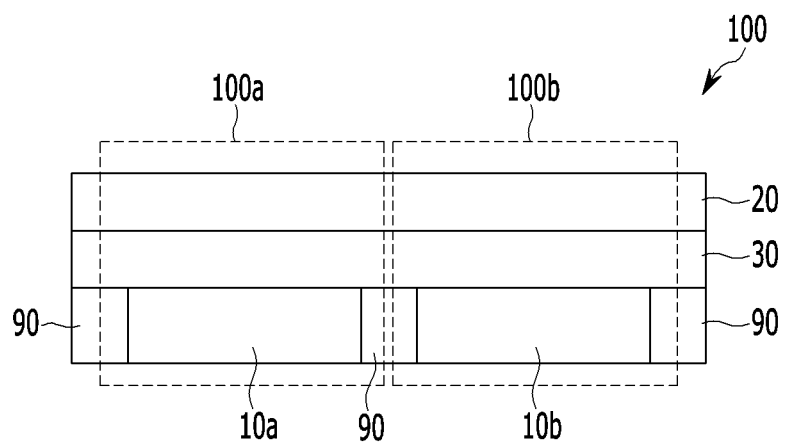
FIG. 4 is a schematic view showing a photoelectric conversion device that includes a photoelectric conversion region having high sensitivity and a photoelectric conversion region having low sensitivity in each image sensor according to some example embodiments.
Figure 5:
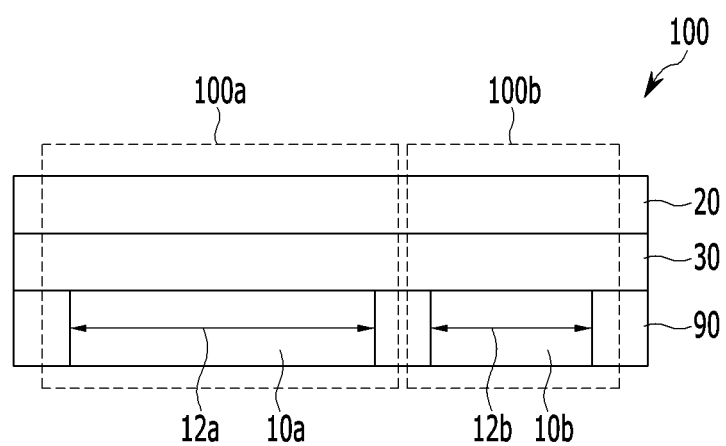
FIG. 5 is a schematic view showing a photoelectric conversion device that includes a photoelectric conversion region having high sensitivity and a photoelectric conversion region having low sensitivity in each image sensor according to some example embodiments.

FIG. 1A is a schematic cross-sectional view of an image sensor according to some example embodiments. FIG. 1B is a schematic cross-sectional view showing a portion of the image sensor shown in FIG. 1A. FIG. 1C is a schematic cross-sectional view showing a portion of the image sensor shown in FIG. 1A. FIG. 2 is a schematic view showing a photoelectric conversion device that includes a photoelectric conversion region having high sensitivity and a photoelectric conversion region having low sensitivity in each image sensor according to some example embodiments. FIG. 3 is a schematic view showing a photoelectric conversion device that includes a photoelectric conversion region having high sensitivity and a photoelectric conversion region having low sensitivity in each image sensor according to some example embodiments. FIG. 4 is a schematic view showing a photoelectric conversion device that includes a photoelectric conversion region having high sensitivity and a photoelectric conversion region having low sensitivity in each image sensor according to some example embodiments. FIG. 5 is a schematic view showing a photoelectric conversion device that includes a photoelectric conversion region having high sensitivity and a photoelectric conversion region having low sensitivity in each image sensor according to some example embodiments.

Referring to FIG. 1A, an image sensor 300 according to some example embodiments includes a semiconductor substrate 110, a lower insulation layer 60, a color filter layer 70, an upper insulation layer 80, and a photoelectric conversion device 100.

The semiconductor substrate 110 may be a silicon substrate, and is integrated with first and second photo-sensing devices 50a and 50b, a transmission transistor 92, and a charge storage 55. The first and second photo-sensing devices 50a and 50b may be, for example, photodiodes.

The first and second photo-sensing devices 50a and 50b, the transmission transistor 92, and/or the charge storage 55 may be integrated in each pixel of the image sensor 300. In some example embodiments, FIG. 1A illustrates an individual pixel, of a plurality of pixels of image sensor 300. The first and second photo-sensing devices 50a and 50b may be configured to sense one or more wavelength spectra of light and may generate separate, respective instances of information based on the sensing. The separate, respective instances of information sensed by the first and second photo-sensing devices 50a and 50b may be transferred to the transmission transistor 92. The transmission transistor 92 may transmit received information to one or more additional devices, including one or more devices that are external to the image sensor 300. An image may be generated based on the information transmitted from the transmission transistor 92, where the image is associated with the incident light sensed at one or more elements of the image sensor 300. The charge storage 55 is electrically connected with the photoelectric conversion device 100 and may receive information associated with the light sensed by the photoelectric conversion device 100, where such information is generated by one or more elements of the photoelectric conversion device 100 based on sensing one or more wavelength spectra of light. Information stored by the charge storage 55 may be transferred to the transmission transistor 92. The transmission transistor 92 may transmit received information, thereby transmitting information associated with the light sensed by the first and second photo-sensing device 50a and 50b and the photoelectric conversion device 100. The transmission transistor 92 may transmit the information to one or external devices that are external to the image sensor 300. The first and second photo-sensing devices 50a and 50b may be disposed in parallel in the substrate 110, relative to a surface 110a of the substrate 110.

In some example embodiments, including the example embodiments shown in FIG. 1B, A metal wire 62 and a pad 64 are formed on the semiconductor substrate 110. In order to decrease signal delay, the metal wire and pad may at least partially comprise a metal having low resistivity, for example, aluminum (Al), copper (Cu), silver (Ag), and alloys thereof, but is not limited thereto. In some example embodiments, the metal wire 62 and pad 64 may be positioned under the photo-sensing devices 50a and 50b.

Referring back to FIG. 1A, the lower insulation layer 60 is formed on the metal wire 62 and the pad 64. The lower insulation layer 60 may at least partially comprise an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 includes a first color filter 70a and a second color filter 70b that may be configured to transmit visible light in different wavelength regions. In the example embodiments illustrated in FIG. 1A, the first and second color filters 70a and 70b are shown, but a third color filter transmitting light in a different wavelength region from those of the first and second color filters 70a and 70b may be further included. The first and second color filters 70a and 70b and the third color filter may be respectively selected from red, blue, and green filters but are not limited thereto.

The upper insulation layer 80 is formed on the color filter layer 70. The upper insulation layer 80 may eliminate a step caused by the color filter layer 70 and smooth the surface 80a above the color filter layer 70. The upper insulation layer 80 and lower insulation layer 60 may include a contact hole (not shown) exposing a pad, and a trench 85 exposing the charge storage 55.

The organic photoelectronic device 100 is formed on the surface 80a of the upper insulation layer 80.

The photoelectric conversion device 100 may be, for example, an organic photoelectric conversion device.

The photoelectric conversion device 100 includes a pixel electrode 10, a common electrode 20, and a light absorption layer 30 between the pixel electrode 10 and the common electrode 20.

The pixel electrode 10 may be disposed separately in each pixel. In some example embodiments, the pixel electrode 10 may be repeatedly arranged along a row and a column. The pixel electrode 10 may include a first pixel electrode 10a and a second pixel electrode 10b, wherein the first pixel electrode 10a may overlap vertically with the first photo-sensing device 50a, and the second pixel electrode 10b may overlap vertically with the second photo-sensing device 50b. The first and second pixel electrodes 10a and 10b may be separated by a planarization layer 90 at least partially comprising an insulating material such as a silicon oxide, a silicon nitride, or a combination thereof. Each pixel electrode 10 is electrically connected to the charge storage 55 through the trench 85.

The common electrode 20 may be formed on a whole surface.

One of the pixel electrode 10 and the common electrode 20 may be an anode and the other may be a cathode. The pixel electrode 10 and the common electrode 20 may be a light-transmitting electrode, and the light-transmitting electrode may at least partially comprise, for example, a transparent conductor such as indium tin oxide (ITO) or indium zinc oxide (IZO), or a metal thin film having a thin thickness of a single layer or a plural layer.

The light absorption layer 30 may be formed on an entire surface 90a as a single layer or a plural layer.

Referring to FIG. 1C, the light absorption layer 30 includes a p-type semiconductor and an n-type semiconductor that form a heterojunction (bulk heterojunction). The light absorption layer 30 is configured to absorb external light 94 (e.g., incident light) to generate excitons and then separates the generated excitons into holes and electrons.

The light absorption layer 30 may selectively absorb light 94 in at least one wavelength spectrum of light out of a wavelength spectrum of visible light, for example light in a first wavelength spectrum of visible light (also referred to herein as 'first visible light') of a green light wavelength spectrum of about 500 nm to about 600 nm, a blue light wavelength spectrum of greater than or equal to about 380 nm and less than about 500 nm, or a red light wavelength spectrum of greater than about 600 nm and less than or equal to about 780 nm. At least one of the p-type semiconductor and n-type semiconductor may be a light-absorbing material configured to selectively absorb one of green light, blue light, and red light. At least one of the p-type semiconductor and n-type semiconductor may be an organic material.

The light absorption layer 30 may include an intrinsic layer (I layer) 30a and further include, for example a p-type layer 30b and/or a n-type layer 30c on one surface or both surfaces of the light absorption layer intrinsic layer 30a. For example, the photoelectric conversion device 100 may include an I layer 30a, a p-type layer 30b/I layer 30a, an I layer 30a/n-type layer 30c, a p-type layer 30b/I layer 30a/n-type layer 30c, and the like between the pixel electrode 10 and the common electrode 20. The p-type layer 30b may include a p-type semiconductor and the n-type layer 30c may include an n-type semiconductor.

The light absorption layer 30 may include, for example a p-type layer 30b and an n-type layer 30c. The p-type layer 30b may include a p-type semiconductor and the n-type layer 30c may include an n-type semiconductor.

The light absorption layer 30 may have a thickness of about 1 nm to about 500 nm. In some example embodiments, the light absorption layer 30 may have a thickness of about 5 nm to about 300 nm. If and/or when the thickness of the light absorption layer 30 is within one or more of the above thickness ranges, the light absorption layer 30 may effectively absorb light, effectively separate holes from electrons, and deliver them, thereby effectively improving photoelectric conversion efficiency.

Referring back to FIG. 1A, an auxiliary layer (not shown) may be further disposed between the pixel electrode 10 and the light absorption layer 30 and/or between the common electrode 20 and the light absorption layer 30. The auxiliary layer may increase mobility of holes and electrons separated in the light absorption layer 30 and increase photoelectric conversion efficiency of the photoelectric conversion device 100.

The auxiliary layer may be, for example at least one selected from a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport, but is not limited thereto.

The auxiliary layer may include, for example, an organic material, an inorganic material, or an organic/inorganic material. The organic material may be an organic compound having hole or electron characteristics, and the inorganic material may be, for example, a metal oxide such as molybdenum oxide, tungsten oxide, nickel oxide, and the like.

In the photoelectric conversion device 100, when light 94 enters from the common electrode 20 and the light absorption layer 30 absorbs light 94 having a predetermined wavelength spectrum, excitons may be produced from the inside the light absorption layer 30. The excitons are separated into holes and electrons in the light absorption layer 30, and the separated holes are transported to the anode that is one of the pixel electrode 10 and the common electrode 20, the separated electrons are transported to the cathode that is the other of the pixel electrode 10 and the common electrode 20 so as to induce a current in the photoelectric conversion device.

In some example embodiments, the photoelectric conversion device 100 may include a plurality of photoelectric conversion regions corresponding to each pixel. For example, each photoelectric conversion region may be defined as a region partitioned by one pixel electrode 10, the light absorption layer 30, and the common electrode 20. As shown in the example embodiments illustrated in FIG. 1A, the photoelectric conversion region may include, for example, a first photoelectric conversion region 100a defined by an overlapping region with the first pixel electrode 10a, a first portion of the light absorption layer 30 vertically overlapping the first pixel electrode 10a, and a first portion of the common electrode 20 that vertically overlaps the first portion of the light absorption layer 30, and a second photoelectric conversion region 100b defined by an overlapping region with the second pixel electrode 10b, a second portion of the light absorption layer 30 vertically overlapping the second pixel electrode 10b, and a second portion of the common electrode 20 that vertically overlaps the second portion of the light absorption layer 30. The first photoelectric conversion region 100a may overlap with the first photo-sensing device 50a and the second photoelectric conversion region 100b may overlap with the second photo-sensing device 50b.

In some example embodiments, the photoelectric conversion device 100 includes a plurality of photoelectric conversion regions having different photoelectric sensitivities (also referred to herein as "sensitivity," "sensitivities," etc.). For example, the photoelectric conversion device 100 may include a high photoelectric sensitivity photoelectric conversion region 100a and a low photoelectric sensitivity photoelectric conversion region 100b. Herein, the high sensitivity and the low sensitivity are relative each other but not determined by a particular boundary range.

In this way, the image sensor 300 according to some example embodiments includes the low and high sensitivity photoelectric conversion regions and thus may expand a light dose range, that is, a dynamic range.

For example, the first photoelectric conversion region 100a and the second photoelectric conversion region 100b may be associated with different sensitivities. For example, the first photoelectric conversion region 100a may have higher sensitivity than the second photoelectric conversion region 100b, and accordingly, the first photoelectric conversion region 100a may be a high sensitivity photoelectric conversion region, and the second photoelectric conversion region 100b may be a low sensitivity photoelectric conversion region.

The first and second photoelectric conversions regions 100a and 100b may have different sensitivities due to various factors including, for example, different photoelectric conversion efficiencies, different areas, different exposure times, some combination thereof, or the like.

For example, the first and second photoelectric conversions regions 100a and 100b may have different sensitivities by differentiating the photoelectric conversion efficiency of the first photoelectric conversion region 100a from that of the second photoelectric conversion region 100b. Herein, the photoelectric conversion efficiency of a photoelectric conversion region may be expressed by external quantum efficiency (EQE). For example, the first photoelectric conversion region 100a may have higher photoelectric conversion efficiency than that of the second photoelectric conversion region 100b. For example, the photoelectric conversion efficiency of the first photoelectric conversion region 100a may be about 1.5 times or greater, for example, about 1.5 times to about 10 times as high as that of the second photoelectric conversion region 100b.

In some example embodiments, the first and second photoelectric conversion regions 100a and 100b may have different photoelectric conversion efficiencies by differentiating charge mobility from the light absorption layer 30 to the first pixel electrode 10a and charge mobility from the light absorption layer 30 to the second pixel electrode 10b, which will be described referring to FIGS. 2 to 4.

Referring to FIG. 2, in some example embodiments, the second photoelectric conversion region 100b may include a charge control layer 40 between the second pixel electrode 10b and the light absorption layer 30, unlike the first photoelectric conversion region 100a wherein the charge control layer 40 may be omitted. The charge control layer 40 between the second pixel electrode 10b and the light absorption layer 30 may decrease mobility of a main charge from the light absorption layer 30 to the second pixel electrode 10b. For example, if and/or when the pixel electrode 10 is an anode and the common electrode 20 is a cathode, the charge control layer 40 may decrease hole mobility from the light absorption layer 30 to the second pixel electrode 10b. For example, if and/or when the pixel electrode 10 is a cathode and the common electrode 20 is an anode, the charge control layer 40 may decrease electron mobility from the light absorption layer 30 to the second pixel electrode 10b.

The charge control layer 40 may include, for example, a material having lower conductivity, that is, larger resistance than those of light absorption layer 30 and the pixel electrode 10. In some example embodiments, the charge control layer 40 may include a material having a sheet resistance of greater than or equal to about $1 \times 10^5 \Omega/sq$. In some example embodiments, the charge control layer 40 may include a material having a sheet resistance of about $1 \times 10^6 \Omega/sq$ to about $1 \times 10^9 \Omega/sq$. Example embodiments included herein are not limited to one or more charge control layers 40 having conductivity and/or sheet resistance as described above. The charge control layer 40 may include, for example, an inorganic material. In some example embodiments, the charge control layer 40 may include a metal oxide, a semi-metal oxide, a metal nitride, a semi-metal nitride, or a combination thereof. The charge control layer 40 may include, for example, a silicon oxide, a silicon nitride, a zinc oxide, or a combination thereof but is not limited thereto.

The charge control layer 40 may include at least one through-hole 99 penetrating between the second pixel electrode 10b and the light absorption layer 30. The through-hole may prevent accumulation of charges between the second pixel electrode 10b and the light absorption layer 30.

In this way, since the first photoelectric conversion region 100a includes no charge control layer 40, but the second photoelectric conversion region 100b includes the charge control layer 40, the second photoelectric conversion region 100b may have lower photoelectric conversion efficiency and resultantly lower sensitivity than the first photoelectric conversion region 100a. Accordingly, the photoelectric conversion device 100 including the high sensitivity photoelectric conversion region and the low sensitivity photoelectric conversion region may be realized.

Referring to FIG. 3, the first pixel electrode 10a included in the first photoelectric conversion region 100a has a different thickness 11a from the thickness 11b of the second pixel electrode 10b included in the second photoelectric conversion region 100b. Accordingly, a portion 91 of the planarization layer 90 separating the first pixel electrode 10a from the second pixel electrode 10b may be filled between the second pixel electrode 10b and the light absorption layer 30 as well as between the first pixel electrode 10a and the second pixel electrode 10b. The planarization layer 90 may at least partially comprise a material having insulating characteristics or very low conductivity characteristics, such as a silicon oxide, a silicon nitride, or a combination thereof, and thus may decrease charge mobility from the light absorption layer 30 to the second pixel electrode 10b in the absence of a charge control layer 40.

Accordingly, the second photoelectric conversion region 100b may have lower photoelectric conversion efficiency and thus lower sensitivity than that of the first photoelectric conversion region 100a. Therefore, the photoelectric conversion device 100 having the high sensitivity photoelectric conversion region and the low sensitivity photoelectric conversion region may be realized.

Referring to FIG. 4, the first pixel electrode 10a included in the first photoelectric conversion region 100a and the second pixel electrode 10b included in the second photoelectric conversion region 100b may respectively include a material having a different sheet resistance. For example, if and/or when the first pixel electrode 10a includes a first transparent conductor, and the second pixel electrode 10b includes a second transparent conductor, the first transparent conductor may have lower sheet resistance than the second transparent conductor. For example, the sheet resistance of the first transparent conductor may be about 10 times or greater than the sheet resistance of the second transparent conductor. In another example, the sheet resistance of the first transparent conductor may be about 10 times to about 1000 times as low as the sheet resistance of the second transparent conductor.

For example, the first and second pixel electrodes 10a and 10b respectively includes ITO, but the ITO of the first pixel electrode 10a and the ITO of the second pixel electrode 10b may have different sheet resistance. For example, the ITO of the first pixel electrode 10a may have greater than or equal to about 10 times lower sheet resistance than the ITO of the second pixel electrode 10b. Herein, the sheet resistance of the ITO may be adjusted by changing the amount of a supplied element such as indium and tin during a deposition process such as sputtering, evaporation and the like, a flow rate of supplied gas, a process condition, and/or the like.

For example, the first pixel electrode 10a and the second pixel electrode 10b respectively includes IZO, wherein the IZO of the first and second pixel electrodes 10a and 10b may have different sheet resistance. For example, the IZO of the first pixel electrode 10a may have about 10 times or greater as low sheet resistance as the IZO of the second pixel electrode 10b. Herein, the sheet resistance of the IZO may be adjusted by changing the amount of a supplied element such as indium, zinc, and the like during a deposition process such as sputtering, evaporation, and the like, a flow rate of supplied gas, a process condition, and/or, the like.

For example, the first and second pixel electrodes 10a and 10b may include metals having different sheet resistance, for example, a conductor of the first pixel electrode 10a may have greater than or equal to about 10 low sheet resistance than a conductor of the second pixel electrode 10b.

In this way, since the first pixel electrode 10a included in the first photoelectric conversion region 100a has different sheet resistance from the second pixel electrode 10b included in the second photoelectric conversion region 100b, the second photoelectric conversion region 100b may have lower photoelectric conversion efficiency and thus lower sensitivity than the first photoelectric conversion region 100b. Accordingly, the photoelectric conversion device 100 including the high sensitivity photoelectric conversion region and the low sensitivity photoelectric conversion region may be realized.

For another example, the first and second photoelectric conversion regions 100a and 100b may have different sensitivity by differentiating the area of the first photoelectric conversion region 100a from that of the second photoelectric conversion region 100b.

Referring to FIG. 5, the first and second photoelectric conversion regions 100a and 100b may have different areas. As shown in FIG. 5, the first and second photoelectric conversion regions 100a and 100b may have different widths corresponding to different widths 12a and 12b of the first and second pixel electrodes 10a and 10b. The different widths 12 and 12b may correspond to the first and second pixel electrodes 10a and 10b having different, respective areas. Since the areas of the first and second photoelectric conversion regions 100a and 100b are determined by the areas of the first and second pixel electrodes 10a and 10b, the first pixel electrode 10a may have a different area from that of the second pixel electrode 10b. For example, the first pixel electrode 10a may have about 1.5 times or greater, for example, about 1.5 times to about 10 times as large area as the second pixel electrode 10b.

In this way, the first photoelectric conversion region 100a may have a different sensitivity from the second photoelectric conversion region 100b by differentiating the area of the first photoelectric conversion region 100a from that of the second photoelectric conversion region 100b, for example, the second photoelectric conversion region 100a may have lower sensitivity than the first photoelectric conversion region 100a by making the area of the second photoelectric conversion region 100a smaller than that of the first photoelectric conversion region 100b. Accordingly, the photoelectric conversion device 100 including the high sensitivity photoelectric conversion region and the low sensitivity photoelectric conversion region may be realized.

Figure 6:
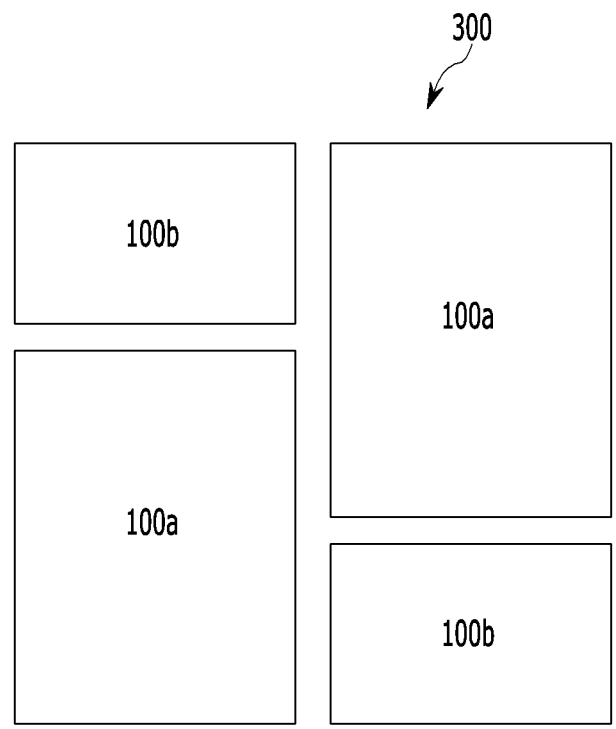
FIG. 6 is a schematic view showing an arrangement of photoelectric conversion regions in each image sensor according to some example embodiments.
Figure 7:
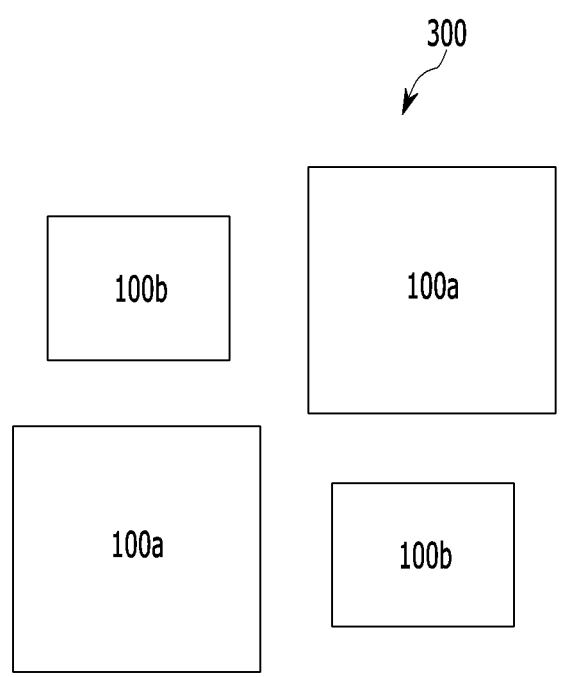
FIG. 7 is a schematic view showing an arrangement of photoelectric conversion regions in each image sensor according to some example embodiments.

FIGS. 6 and 7 are schematic views showing arrangement of photoelectric conversion regions in each image sensor according to some example embodiments.

Referring to FIG. 6, in an image sensor having a unit pixel group as a 2×2 matrix, a plurality of photoelectric conversion regions may respectively include two first photoelectric conversion regions 100a having a larger area and two second photoelectric conversion regions 100b having a smaller area. Herein, the first photoelectric conversion region 100a may have the same area as that of the first pixel electrode 10a, and thus the second photoelectric conversion region 100b may have the same area as that of the second pixel electrode 10b. The first pixel electrode 10a may have a larger area than that of a pixel electrode of a conventional photoelectric conversion device including a plurality of pixel electrodes having the same area, and the second pixel electrode 10b may have a smaller area than that of the pixel electrode of the conventional photoelectric conversion device including the pixel electrodes having the same area.

Referring to FIG. 7, in an image sensor having a unit pixel group as a 2×2 matrix, a plurality of photoelectric conversion regions may respectively include two first photoelectric conversion regions 100a having a larger area and two second photoelectric conversion regions 100b having a smaller area. Herein, the first photoelectric conversion region 100a may the same area as that of the first pixel electrode 10a, and the second photoelectric conversion region 100b may have the same area as that of the second pixel electrode 10b. The first pixel electrode 10a may have the same area as that of a pixel electrode of a conventional photoelectric conversion device including plurality of pixel electrode having the same size, and the second pixel electrode 10b may have the same area as that of the pixel electrode of the conventional photoelectric conversion device including the pixel electrodes having the same size.

FIGS. 6 and 7 show a unit pixel group as a 2×2 matrix including two first photoelectric conversion regions 100a and two second photoelectric conversion regions 100b. In some example embodiments, if and/or when at least one photoelectric conversion region having a different area is included, the number ("quantity") of first and second photoelectric conversion regions 100a and 100b, the structure of the unit pixel group, and the like have no limit.

In this way, the light dose range, that is, the dynamic range of an image sensor, may be expanded by including a high sensitivity photoelectric conversion region and a low sensitivity photoelectric conversion region according to various examples. In other words, when a bright object and a dark object coexist in a scene sensed by the image sensor 300, such that one or more images of the scene may be generated based on information generated by one or more elements of the image sensor 300, the bright object in the scene may be expressed by a low sensitivity image even though exposure time is increased to express the dark object in the scene, and thus an image having a wide dynamic range (also referred to as high dynamic range) may be generated based on light from the scene being sensed by the image sensor.

Hereinafter, an image sensor according to some example embodiments is described.

Figure 8:
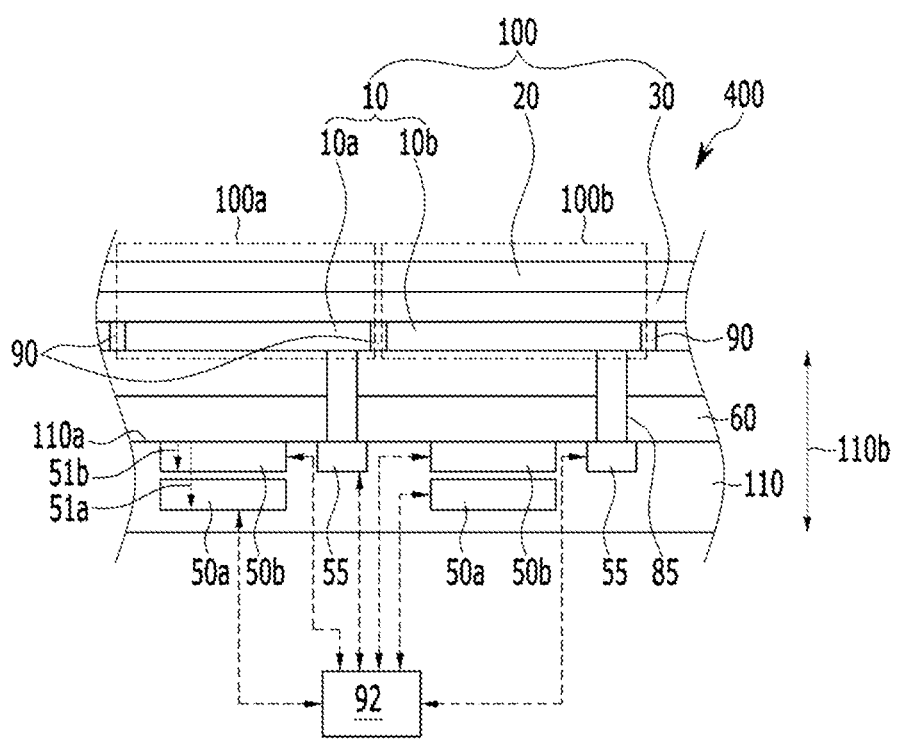
FIG. 8 is a cross-sectional view showing an image sensor according to some example embodiments.

FIG. 8 is a cross-sectional view showing an image sensor according to some example embodiments.

The image sensor 400 according to the present embodiment includes the semiconductor substrate 110, the lower insulation layer 60, and the photoelectric conversion device 100 like the above embodiment.

In some example embodiments, including the example embodiments illustrated in FIG. 8, the image sensor 400 includes no color filter layer, and the first and second photo-sensing devices 50a and 50b are disposed to vertically overlap each other in a thickness direction 110b of the semiconductor substrate 110. The first and second photo-sensing devices 50a and 50b may be positioned at different depths 51a, 51b from the surface 110a of the semiconductor substrate 110, for example, the first photo-sensing device 50a may be positioned deeper than the second photo-sensing device 50b from the surface 110a of the semiconductor substrate 110, and the second photo-sensing device 50b may be positioned closer to the surface 110a of the semiconductor substrate 110 than the first photo-sensing device 50a.

The first and second photo-sensing devices 50a and 50b may sense light in a different wavelength spectrum of light out of a plurality of wavelength spectra of light, based at least in part upon their respective depths 51a, 51b from the surface 110a of the semiconductor substrate 110. For example, the first photo-sensing device 50a positioned deeper from the surface 110a of the semiconductor substrate 110 may sense light in a second wavelength spectrum of light (also referred to herein as 'second visible light') differing from a first wavelength spectrum of light, and the second photo-sensing device 50b positioned closer to the surface of the semiconductor substrate 110 may sense light in a third wavelength spectrum of light (also referred to herein as 'third visible light'), which is in a shorter wavelength region than the second wavelength spectrum of light. Accordingly, light in different wavelength spectra of light depending on a depth from the surface of the semiconductor substrate 110 may be sensed without a separate color filter or a wavelength separation layer.

The second visible light and the third visible light have a different maximum absorption wavelength ($\lambda_{max}$) region each other, for example, the maximum absorption wavelength of the second visible light may be positioned in a greater than or equal to about 30 nm longer wavelength spectrum of light and specifically, in a greater than or equal to about 50 nm longer wavelength spectrum of light than the maximum absorption wavelength of the third visible light.

For example, if and/or when the aforementioned light absorption layer 30 is configured to selectively absorb the first visible light having a maximum absorption wavelength within a range of about 500 nm to about 580 nm, the second visible light may have a maximum absorption wavelength within a range of greater than about 580 nm and less than about 700 nm, and the third visible light may have a maximum absorption wavelength within a range of greater than about 380 nm and less than 500 nm. Within the range, the second visible light may have, for example, a maximum absorption wavelength within a range of about 600 nm to about 680 nm, and the third visible light may have a maximum absorption wavelength, for example, within a range of about 420 nm to about 480 nm. For example, if and/or when the above light absorption layer 30 is configured to selectively absorb green light, the first photo-sensing device 50a may be configured to sense red light, and the second photo-sensing device 50b may be configured to sense blue light.

In this way, the first and second photo-sensing devices 50a and 50b may vertically overlap each other in the thickness direction 110b of the semiconductor substrate 110 and thus may reduce the area of an image sensor 400 and down-size the image sensor 400.

In addition, the first and second photo-sensing devices 50a and 50b may sense light in different wavelength spectra of light, based at least in part upon a depth from the surface of the semiconductor substrate 110 without a separate color filter and a wavelength separation layer. Accordingly, a light loss due to the color filter may not only be reduced, but an entire process may be simplified by omitting a process of forming the color filter and the wavelength separation layer.

As described above, the photoelectric conversion device 100 may include a plurality of photoelectric conversion region having different sensitivity, for example, the first and second photoelectric conversion regions 100a and 100b having different sensitivity. The photoelectric conversion device 100 is the same as described above, and examples shown in FIGS. 2 to 7 may be equally applied to the image sensor 400 according to the embodiment.

The image sensor 400 may be applied to, for example, various electronic devices such as a mobile phone or a digital camera, but is not limited thereto.

Figure 9:
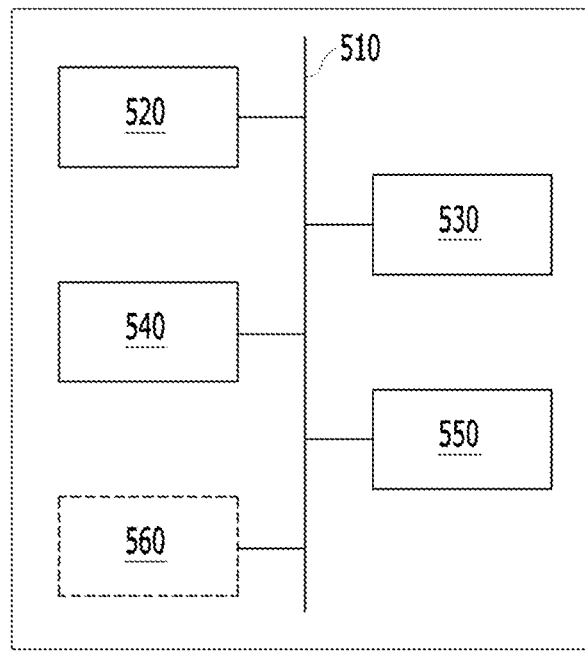
FIG. 9 is a diagram illustrating an electronic device according to some example embodiments.

FIG. 9 is a diagram illustrating an electronic device 500 according to some example embodiments.

Referring to FIG. 9, the electronic device 500 includes a memory 520, a processor 530, an image sensor 540, and a communication interface 550. The image sensor 540 may include any of the image sensors illustrated and described herein, including the example embodiments of image sensor 300 shown in FIGS. 1A-C and FIGS. 2-7 and image sensor 400 shown in FIG. 8.

The electronic device 500 may be included in one or more various electronic devices, including, for example, a mobile phone, a digital camera, a sensor device, a biosensor device, and the like. In some example embodiments, the electronic device 500 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 520, the processor 530, the image sensor 540, and the communication interface 550 may communicate with one another through a bus 510.

The communication interface 550 may communicate data from an external device using various Internet protocols. For example, the communication interface 550 may communicate sensor data generated by the image sensor 540 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 530 may execute a program and control the electronic device 500. A program code to be executed by the processor 530 may be stored in the memory 520. An electronic system may be connected to an external device through an input/output device (not shown) and exchange data with the external device.

The memory 520 may store information output from the image sensor 540, including information transmitted from the transistor 92. The memory 520 may be a volatile or a nonvolatile memory. The memory 520 may be a non-transitory computer readable storage medium. The memory may store computer-readable instructions that, when executed, cause the execution of one or more methods, functions, processes, etc. as described herein. In some example embodiments, the processor 530 may execute one or more of the computer-readable instructions stored at the memory 520.

In some example embodiments, the electronic device may include a display panel 560 that may output an image generated based at least in part upon information output from the image sensor 540.

In some example embodiments, element 560 may be absent from the electronic device 500. In some example embodiments, the communication interface 550 may include a USB and/or HDMI interface. In some example embodiments, the communication interface 550 may include a wireless communication interface.

While this disclosure has been described in connection with what is presently considered to be practical example embodiments, it is to be understood that the invention is not limited to the disclosed example embodiments, but, in some example embodiments, is intended to cover various modifications and equivalent arrangements included within the spirit and scope of the appended claims.

What is claimed is:

1. An image sensor, comprising
    a semiconductor substrate, and
    a photoelectric conversion device on the semiconductor substrate, the photoelectric conversion device including a plurality of pixel electrodes, a common electrode, and a light absorption layer including an organic material, the light absorption layer between the plurality of pixel electrodes and the common electrode, the plurality of pixel electrodes including a first pixel electrode and a second pixel electrode that are disposed separately in each pixel,
    wherein the photoelectric conversion device includes
        a first photoelectric conversion region defined by an overlapping region of the first pixel electrode, the common electrode, and the light absorption layer between the first pixel electrode and the common electrode, the first photoelectric conversion region being associated with a first photoelectric sensitivity, and
        a second photoelectric conversion region defined by an overlapping region of the second pixel electrode, the common electrode, and the light absorption layer between the second pixel electrode and the common electrode, the second photoelectric conversion region being associated with a second photoelectric sensitivity, and
    wherein the first photoelectric sensitivity is greater than the second photoelectric sensitivity,
    wherein the second photoelectric conversion region includes a charge control layer between the second pixel electrode and the light absorption layer, and the charge control layer is configured to reduce charge mobility from the light absorption layer to the second pixel electrode and has a constant thickness.

2. The image sensor of claim 1, wherein, the first photoelectric conversion region is associated with a first photoelectric conversion efficiency, the second photoelectric conversion region is associated with a second photoelectric conversion efficiency, and the first photoelectric conversion efficiency is greater than the second photoelectric conversion efficiency.

3. The image sensor of claim 2, wherein the photoelectric conversion device includes a planarization layer between the first pixel electrode and the second pixel electrode and between the second pixel electrode and the light absorption layer.

4. The image sensor of claim 3, wherein the planarization layer includes at least one of a silicon oxide material and a silicon nitride material.

5. The image sensor of claim 2, wherein, the first pixel electrode includes a first transparent conductor, the second pixel electrode includes a second transparent conductor, and a sheet resistance of the first transparent conductor is lower than a sheet resistance of the second transparent conductor.

6. The image sensor of claim 5, wherein, the first transparent conductor and the second transparent conductor include one of an indium tin oxide (ITO) material or an indium zinc oxide (IZO) material, the ITO and the IZO materials have different sheet resistances, and the sheet resistance of the first transparent conductor is less than the sheet resistance of the second transparent conductor by a factor of at least approximately ten.

7. The image sensor of claim 5, wherein, the first transparent conductor and the second transparent conductor each include a different metal, respectively, and the sheet resistance of the first transparent conductor is less than the sheet resistance of the second transparent conductor by a factor of at least approximately ten.

8. The image sensor of claim 2, wherein the first pixel electrode and the second pixel electrode have different areas, respectively.

9. The image sensor of claim 2, wherein the first photoelectric conversion efficiency is greater than the second photoelectric conversion efficiency by a factor of at least approximately 1.5.

10. The image sensor of claim 1, wherein the charge control layer includes an inorganic material.

11. The image sensor of claim 1, wherein the charge control layer includes at least one through-hole between the second pixel electrode and the light absorption layer.

12. The image sensor of claim 1, wherein the first pixel electrode and the second pixel electrode have different areas, respectively.

13. The image sensor of claim 12, wherein an area of the first pixel electrode is greater than an area of the second pixel electrode by a factor of at least approximately 1.5.

14. The image sensor of claim 1, wherein the light absorption layer is configured to selectively absorb a first wavelength spectrum of light selected from one of, a wavelength spectrum associated with red light,
a wavelength spectrum associated with green light, and
a wavelength spectrum associated with blue light, the semiconductor substrate includes a first photo-sensing device configured to sense a second wavelength spectrum of light selected from one of the wavelength spectrum associated with red light,
the wavelength spectrum associated with green light, and
the wavelength spectrum associated with blue light, and a second photo-sensing device configured to sense a third wavelength spectrum of light selected from one of the wavelength spectrum associated with red light,
the wavelength spectrum associated with green light, and
the wavelength spectrum associated with blue light, and the first wavelength spectrum of light, the second wavelength spectrum of light and the third wavelength spectrum of light are each different wavelength spectra of light.

15. The image sensor of claim 14, wherein the first photo-sensing device and the second photo-sensing device are substantially parallel to a surface of the semiconductor substrate.

16. The image sensor of claim 15, wherein, the first photoelectric conversion region vertically overlaps with one of the first photo-sensing device and the second photo-sensing device, and the second photoelectric conversion region vertically overlaps with another one of the first photo-sensing device and the second photo-sensing device.

17. The image sensor of claim 14, wherein the first photo-sensing device and the second photo-sensing device vertically overlap with each other in a thickness direction of the semiconductor substrate.

18. An electronic device including the image sensor of claim 1.

19. An image sensor, comprising a first photoelectric conversion region that includes a first pixel electrode, a first portion of a light absorption layer on the first pixel electrode, and a first portion of a common electrode on the first portion of the light absorption layer, the light absorption layer including a first organic material, wherein the first photoelectric conversion region is associated with a first photoelectric sensitivity; and a second photoelectric conversion region that includes a second pixel electrode, a second portion of the light absorption layer on the second pixel electrode, and a second portion of the common electrode on the second portion of the light absorption layer, the light absorption layer including a second organic material, wherein the first pixel electrode and the second pixel electrode are disposed separately in each pixel, and wherein the second photoelectric conversion region is associated with a second photoelectric sensitivity, and the second photoelectric sensitivity is different than the first photoelectric sensitivity, wherein the second photoelectric conversion region includes a charge control layer between the second pixel electrode and the second portion of the light absorption layer, and the charge control layer is configured to reduce charge mobility from the light absorption layer to the second pixel electrode and has a constant thickness.

20. The image sensor of claim 19, further comprising:
a planarization layer between the first pixel electrode and the second pixel electrode and between the second pixel electrode and the second portion of the light absorption layer.

21. The image sensor of claim 19, wherein,
the first pixel electrode has a lower sheet resistance than the second pixel electrode.

22. The image sensor of claim 19, wherein the first pixel electrode and the second pixel electrode have different areas, respectively.

23. The image sensor of claim 19, further comprising:
a semiconductor substrate that includes,
  a first photo-sensing device that vertically overlaps the first photoelectric conversion region, and
  a second photo-sensing device that vertically overlaps the second photoelectric conversion region.

24. The image sensor of claim 23, wherein the first photo-sensing device and the second photo-sensing device are configured to sense different wavelength spectra of light.

25. The image sensor of claim 19, further comprising:
a semiconductor substrate that includes,
  a first photo-sensing device that vertically overlaps the first photoelectric conversion region, and
  a second photo-sensing device that vertically overlaps the first photo-sensing device.

26. An electronic device including the image sensor of claim 19.

27. A photoelectric conversion device, comprising:
first and second pixel electrodes, the first and second pixel electrodes being disposed separately in each pixel;
a light absorption layer on the first and second pixel electrodes, the light absorption layer including a p-type semiconductor and an n-type semiconductor that form a heterojunction, at least one of the p-type semiconductor and n-type semiconductor being configured to absorb light in at least one wavelength spectrum of light out of a wavelength spectrum of visible light;
a common electrode on the light absorption layer; and
a charge control layer between the second pixel electrode and the light absorption layer, wherein the charge control layer is not between the first pixel electrode and the light absorption layer,
wherein the charge control layer is configured to reduce charge mobility from the light absorption layer to the second pixel electrode and has a constant thickness.

28. The photoelectric conversion device of claim 27, wherein the charge control layer includes at least one through-hole between the second pixel electrode and the light absorption layer.

29. An electronic device including the photoelectric conversion device of claim 27.

* * * * *